(12) United States Patent
Itabashi et al.

(10) Patent No.: US 9,425,009 B2
(45) Date of Patent: Aug. 23, 2016

(54) ELECTRONIC CONTROL DEVICE INCLUDING INTERRUPT WIRE

(71) Applicants: DENSO CORPORATION, Kariya, Aichi-Pref. (JP); Murata Manufacturing Co., Ltd., Nagaokakyo-shi, Kyoto-fu (JP)

(72) Inventors: Toru Itabashi, Anjo (JP); Yuuki Mikami, Kariya (JP); Takahiko Furuta, Kasugai (JP); Ryoichi Shiraishi, Obu (JP); Hiroaki Nakamura, Nagaokakyo (JP); Shigeki Nishiyama, Nagaokakyo (JP)

(73) Assignees: DENSO CORPORATION, Kariya (JP); Murata Manufacturing Co., Ltd., Nagaokakyo-shi (JP)

( * ) Notice: Subject to any disclaimer, the term of this patent is extended or adjusted under 35 U.S.C. 154(b) by 151 days.

(21) Appl. No.: 14/284,499

(22) Filed: May 22, 2014

(65) Prior Publication Data

US 2014/0253282 A1    Sep. 11, 2014

Related U.S. Application Data

(63) Continuation of application No. 13/362,497, filed on Jan. 31, 2012, now Pat. No. 8,773,833.

(30) Foreign Application Priority Data

Feb. 4, 2011    (JP) .................................. 2011-022924

(51) Int. Cl.
*H01H 37/32* (2006.01)
*H01H 37/64* (2006.01)
(Continued)

(52) U.S. Cl.
CPC ............. *H01H 37/32* (2013.01); *H01H 37/64* (2013.01); *H01H 85/046* (2013.01);
(Continued)

(58) Field of Classification Search
CPC .... H01H 37/32; H01H 37/64; H01H 69/022; H01H 85/046; H05K 1/0293; H05K 1/111; H05K 3/3442; H05K 2201/09727; H05K 2201/10181

USPC .......................................................... 361/104
See application file for complete search history.

(56) References Cited

U.S. PATENT DOCUMENTS 3,747,041 A    7/1973  Cameron
5,363,272 A    11/1994 Tanaka et al.
(Continued)

FOREIGN PATENT DOCUMENTS

JP    52-168254 U    12/1977
JP    54-159163 U    11/1979
(Continued)

OTHER PUBLICATIONS

Office Action dated Jul. 31, 2014 issued in corresponding U.S. Appl. No. 13/362,562.
(Continued)

*Primary Examiner* — Thienvu Tran
*Assistant Examiner* — Kevin J Comber
(74) *Attorney, Agent, or Firm* — Posz Law Group, PLC

(57) ABSTRACT

An electronic control device includes a substrate, a plurality of component-mounted wires disposed on the substrate, a plurality of electronic components mounted on the respective component-mounted wires, a common wire disposed on the substrate and coupled with each of the electronic components, an interrupt wire coupled between one of the component-mounted wires and the common wire, a connection wire via which the interrupt wire is coupled with one of the common wire and the one of the component-mounted wires, and a solder disposed between each of the electronic components and a corresponding one of the component-mounted wires and having a lower melting point than the interrupt wire. The interrupt wire is configured to melt in accordance with heat generated by an overcurrent so as to interrupt a coupling between the one of the component-mounted wires and the common wire.

9 Claims, 13 Drawing Sheets

(51) Int. Cl.
*H05K 1/02* (2006.01)
*H01H 85/046* (2006.01)
*H05K 1/11* (2006.01)
*H05K 3/34* (2006.01)
*H01H 69/02* (2006.01)

(52) U.S. Cl.
CPC ......... *H05K 1/0293* (2013.01); *H01H 69/022* (2013.01); *H05K 1/111* (2013.01); *H05K 3/3442* (2013.01); *H05K 2201/09727* (2013.01); *H05K 2201/10181* (2013.01)

(56) References Cited

U.S. PATENT DOCUMENTS

| | | | |
|---|---|---|---|
| 5,668,522 | A | 9/1997 | Kondo et al. |
| 5,752,047 | A | 5/1998 | Darty et al. |
| 5,781,096 | A | 7/1998 | Yasukuni et al. |
| 5,808,351 | A | 9/1998 | Nathan et al. |
| 5,914,524 | A | 6/1999 | Komenaka |
| 6,163,244 | A | 12/2000 | Endo et al. |
| 6,933,591 | B1 | 8/2005 | Sidhu et al. |
| 7,064,648 | B2 | 6/2006 | Tanaka |
| 7,116,208 | B2 | 10/2006 | Nishimura et al. |
| 7,124,390 | B2 | 10/2006 | Smith et al. |
| 7,385,475 | B2 | 6/2008 | Bender et al. |
| 8,659,384 | B2 | 2/2014 | Dietsch et al. |
| 2003/0048620 | A1 | 3/2003 | Nishimura et al. |
| 2003/0218528 | A1* | 11/2003 | Stavnes et al. ............... 337/159 |
| 2004/0184211 | A1 | 9/2004 | Bender et al. |
| 2005/0141164 | A1 | 6/2005 | Bender et al. |
| 2008/0239684 | A1 | 10/2008 | Yamasaki |
| 2011/0051388 | A1 | 3/2011 | Luppold et al. |
| 2012/0200972 | A1 | 8/2012 | Furuta et al. |
| 2012/0200973 | A1 | 8/2012 | Shiraishi et al. |
| 2012/0200974 | A1 | 8/2012 | Mikami et al. |
| 2012/0201010 | A1 | 8/2012 | Furuta et al. |

FOREIGN PATENT DOCUMENTS

| | | |
|---|---|---|
| JP | 54-177551 U | 12/1979 |
| JP | 55-14730 U | 1/1980 |
| JP | 55-14731 U | 1/1980 |
| JP | 55-108776 U | 7/1980 |
| JP | 62-107341 U | 7/1987 |
| JP | 64-013650 U | 1/1989 |
| JP | 07-078547 A | 3/1995 |
| JP | 11-144604 A | 5/1999 |
| JP | 2000-003662 A | 1/2000 |
| JP | 2000-164992 A | 6/2000 |
| JP | 2002-140975 A | 5/2002 |
| JP | 2003-019933 A | 1/2003 |
| JP | 2003-173730 A | 6/2003 |
| JP | 2004-158377 A | 6/2004 |
| JP | 2006-114606 A | 4/2006 |
| JP | 2007095592 A | 4/2007 |
| JP | 2007-311467 A | 11/2007 |
| JP | 2008-060381 A | 3/2008 |

OTHER PUBLICATIONS

Japanese Office Action issued from the Japanese Patent Office mailed Nov. 13, 2012 in the related Japanese application No. 2011-022929 (with English translation).
Japanese Office Action issued from the Japanese Patent Office mailed Nov. 13, 2012 in the related Japanese application No. 2011-022926 (with English translation).
Japanese Office Action issued from the Japanese Patent Office mailed Nov. 13, 2012 in the related Japanese application No. 2011-022925 (with English translation).
Japanese Office Action issued from the Japanese Patent Office mailed Nov. 13, 2012 in the corresponding Japanese application No. 2011-022924 (with English translation).
Japanese Office Action issued from the Japanese Patent Office mailed Nov. 13, 2012 in the related Japanese application No. 2011-022931 (with English translation).
Japanese Office Action issued from the Japanese Patent Office mailed Nov. 13, 2012 in the related Japanese application No. 2011-022927 (with English translation).
Japanese Office Action issued from the Japanese Patent Office mailed Nov. 13, 2012 in the related Japanese application No. 2011-022928 (with English translation).
Japanese Office Action issued from the Japanese Patent Office mailed Nov. 13, 2012 in the related Japanese application No. 2011-022930 (with English translation).
Japanese Office Action issued from the Japanese Patent Office mailed Jul. 2, 2013 in the related Japanese application No. 2011-022929 (with English translation).
Japanese Office Action issued from the Japanese Patent Office mailed Jul. 2, 2013 in the related Japanese application No. 2011-022925 (with English translation).
Japanese Office Action issued from the Japanese Patent Office mailed Jul. 2, 2013 in the related Japanese application No. 2011-022931 (with English translation).
Japanese Office Action issued from the Japanese Patent Office mailed Jul. 23, 2013 in the Japanese application No. 2013-002744, which is a Divisional Application of the related Japanese application No. 2011-022928 (with English translation).
Japanese Office Action issued from the Japanese Patent Office mailed Sep. 17, 2013 in the related Japanese application No. 2013-002745 (with English translation).
Japanese Office Action issued from the Japanese Patent Office mailed Nov. 19, 2013 in the Japanese application No. 2013-001731, which is a Divisional Application of the related Japanese application No. 2011-022927 (with English translation).
Chinese Office Action issued from the Chinese Patent Office mailed Feb. 7, 2014 in the corresponding Chinese application No. 201210025189.0 (with English translation).
Office Action mailed Jun. 16, 2015 in the corresponding DE application No. 10 2012 201 536.1 (English translation attached).

* cited by examiner

ELECTRONIC CONTROL DEVICE INCLUDING INTERRUPT WIRE

CROSS REFERENCE TO RELATED APPLICATIONS

The present application is a continuation of U.S. application Ser. No. 13/362,497 filed on Jan. 31, 2012, which is based on and claim priority to Japanese Patent Application No. 2011-22924 filed on Feb. 4, 2011, the disclosure of which is incorporated herein by reference.

TECHNICAL FIELD

The present invention relates to an electronic control device including an interrupt wire for overcurrent protection.

BACKGROUND

Conventionally, an electronic control device includes a fuse in case of a fault in the electronic control device. In an electronic control device in which small components are densely arranged, because a short-circuit current generated at a short-circuit fault in the small components does not reach a high current, it takes a long time to interrupt by the fuse. Especially when a large fuse is used for protecting a plurality of electronic control devices so as to reduce the number of fuses and a cost, it takes a longer time. Thus, temperatures of the components may be increased at an interruption and a voltage drop in a power supply wire and the like may be caused for a long time. In contrast, in a common wire, such as a power supply wire (e.g., a battery path and a ground path), that supplies electric power required for operating many circuits and many components mounted in accordance with advancement and diversification of electronic control, a relatively high current flows. Thus, an interrupting current of a large fuse disposed in a common wire path is further increased, and the electronic control device does not secure a sufficient interrupt performance at a short-circuit fault in each circuit or each component. The above-described issue becomes noticeable, for example, in an electronic control device for a vehicle used at a higher temperature and including many mounted devices.

JP-A-2007-311467 discloses a printed circuit board control device in which an interrupt wire is disposed in a power supply wire in each substrate. If an overcurrent flows, the interrupt wire melts and the power sully wire is interrupted in each substrate or each device.

On a substrate in which components are densely mounted, a component-mounted wire, such as a land, on which an electronic component is mounted, and a common wire shared by a plurality of electronic components including the electronic component are disposed adjacent to each other. Thus, when an interrupt wire is disposed in a wire coupling the component-mounted wire and the common wire, neat generated by an overcurrent at the interrupt wire is transmitted to the component-mounted wire and the common wire. Thus, a temperature rise of the interrupt wire may vary and an interrupt performance of the interrupt wire may be decreased. As examples of the decrease in the interrupt performance, a melting time and an interrupting current of the interrupt wire may vary or may increase.

SUMMARY

In view of the foregoing problems, it is an object of the present invention to provide an electronic control device, which can restrict a decrease in an interrupt performance by an interrupt wire.

An electronic control device according to an aspect of the present invention includes a substrate, a plurality of component-mounted wires, a plurality of electronic components, a common wire, an interrupt wire, a connection wire and a solder. The component-mounted wires are disposed on the substrate. The electronic components are mounted on the respective component-mounted wires. The common wire is disposed on the substrate and is coupled with each of the electronic components. The interrupt wire is coupled between one of the component-mounted wires and the common wire. The interrupt wire is configured to melt in accordance with heat generated by an overcurrent so as to interrupt a coupling between the one of the component-mounted wires and the common wire via the interrupt wire. The interrupt wire is coupled with a connection object, which is one of the common wire and the one of the component-mounted wires, via the connection wire. The solder is disposed between each of the electronic components and a corresponding one of the component-mounted wires. The solder has a lower melting point than the interrupt wire. The connection wire has a first end portion adjacent to the interrupt wire and a second end portion adjacent to the connection object. A cross-sectional area of the first end portion of the interrupt wire is smaller than a cross-sectional area of the second end portion of the interrupt wire.

In the above electronic control device, when heat generated at the interrupt wire is transmitted to the connection object via the connection wire, the heat is gradually diffused in the connection wire and is not absorbed excessively to the connection object. Therefore, even when the connection object is mounted on one of the component-mounted wire with the solder having a lower melting point than the interrupt wire, the solder is less likely to be melted by the heat from the interrupt wire. Accordingly, a temperature rise in the interrupt wire can be restricted and a decrease in an interrupt performance of the interrupt wire can be restricted.

BRIEF DESCRIPTION OF THE DRAWINGS

Additional objects and advantages of the present invention will be more readily apparent from the following detailed description when taken together with the accompanying drawings. In the drawings.

DETAILED DESCRIPTION

First Embodiment

Figure 1:
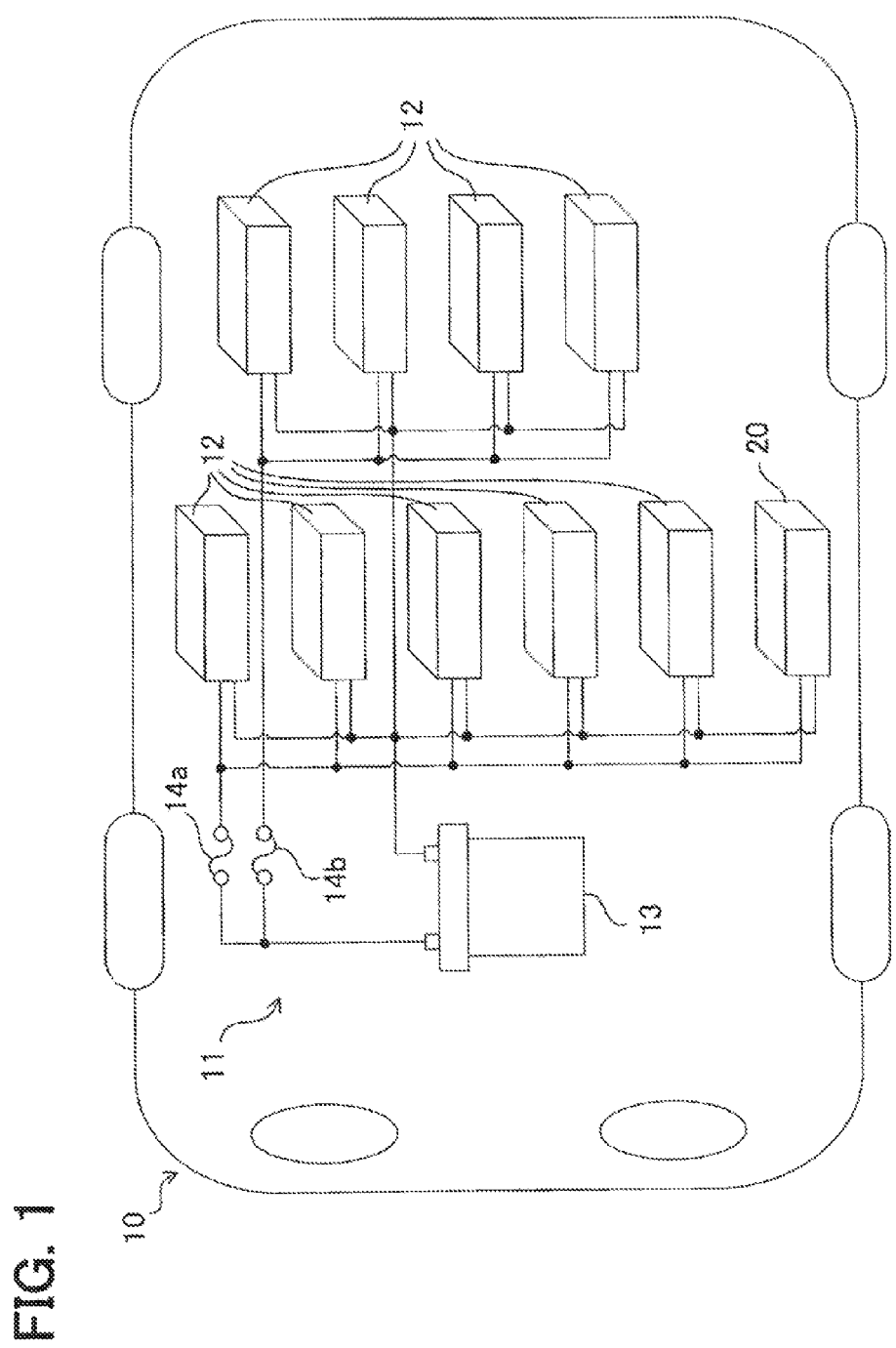
FIG. 1 is a block diagram showing a vehicle control system including a traction control device according to a first embodiment of the present disclosure.

An electronic control device according to a first embodiment of the resent disclosure will be described with reference to drawings. The electronic control device according to the present embodiment can be suitably used as a traction control device 20 included in a vehicle control system 11. As shown in FIG. 1, the vehicle control system 11 includes a plurality of electronic control devices 12 that include the traction control device 20, an engine electronic control unit (ECU), a brake ECU, a steering ECU, a body ECU, a navigation device, and the like.

The traction control device 20 restricts an acceleration slip of a driving wheel. In a vehicle control such as a running control, the traction control device 20 is less important than other electronic control devices.

The electronic control devices 12 including the traction control device 20 are electrically coupled with a battery 13 via one of fuses 14a, 14b used for overcurrent protection. The battery 13 is a direct-current power source. Because each of the fuses 14a, 14b is disposed on a power supply path for supplying electric power to many electronic control devices, each of the fuses 14a, 14b may be a large fuse for 15 A or 20 A. When one of the electronic control devices 12 coupled with the fuse 14a has abnormality and an overcurrent greater than a predetermined current value is generated, the fuse 14a blows out by the overcurrent, and a power supply via the fuse 14a is interrupted. Thus, an adverse influence to the other electronic control devices 12 can be restricted. In an example shown in FIG. 1, each of the electronic control devices 12 is electrically coupled with the battery 13 via one of the fuses 14a, 14b. However, all the electronic control devices 12 may also be electrically coupled with the battery 13 via a single fuse, or each of the electronic control devices 12 may also be electrically coupled with the battery 13 via one of more than two fuses.

The traction control device 20 according to the present embodiment will be described with reference to FIG. 2 to FIG. 4.

The traction control device 20 includes the circuit substrate 21 housed in a casing (not shown). On the circuit substrate 21, a plurality of electronic components 22 for restricting an acceleration slip is densely-mounted on the circuit substrate 21. The circuit substrate 21 is electrically coupled with an external device and other electronic control devices 12 via, for example, a connector, and restricts an acceleration slip of the driving wheel based on a predetermined signal.

Each of the electronic components 22 on the circuit substrate 21 is electrically coupled with a power supply wire 23. The power supply wire 23 is coupled with the battery 13 by the power supply path via the fuse 14a and supplies electric power from the battery 13 to each of the electronic components 22. Thus, the power supply wire 23 is an example of a common wire shared by the electronic components 22.

Figure 2:
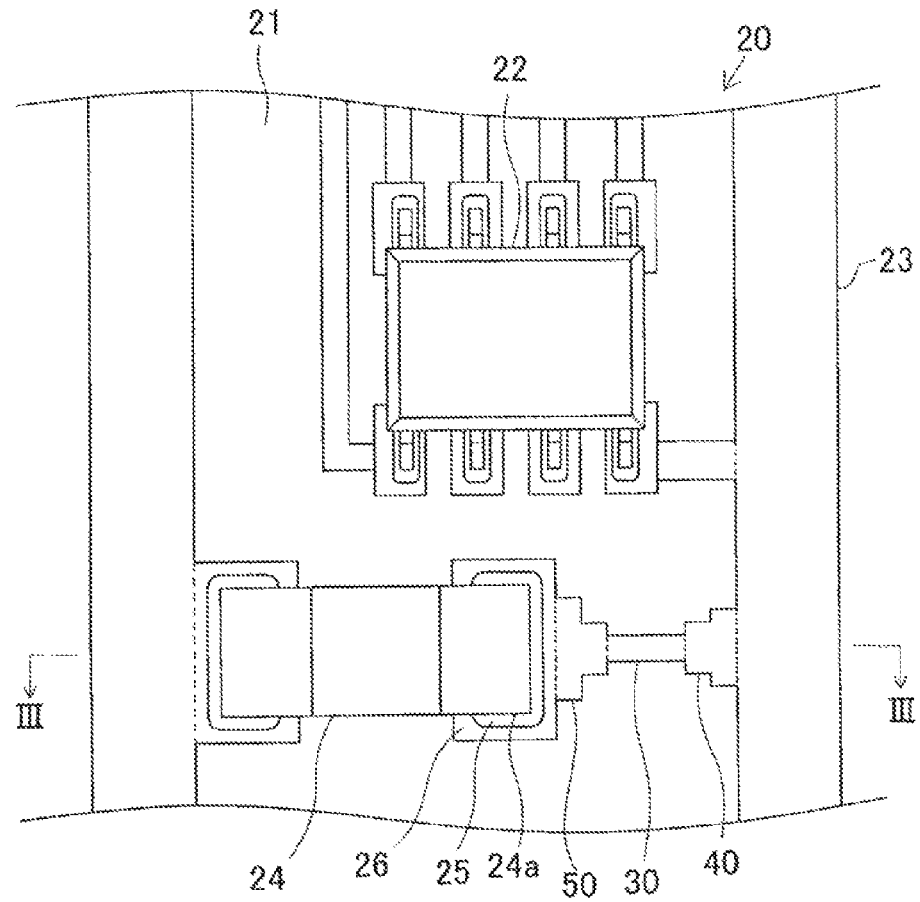
FIG. 2 is a diagram showing a part of the traction control device according to the first embodiment.
Figure 3:
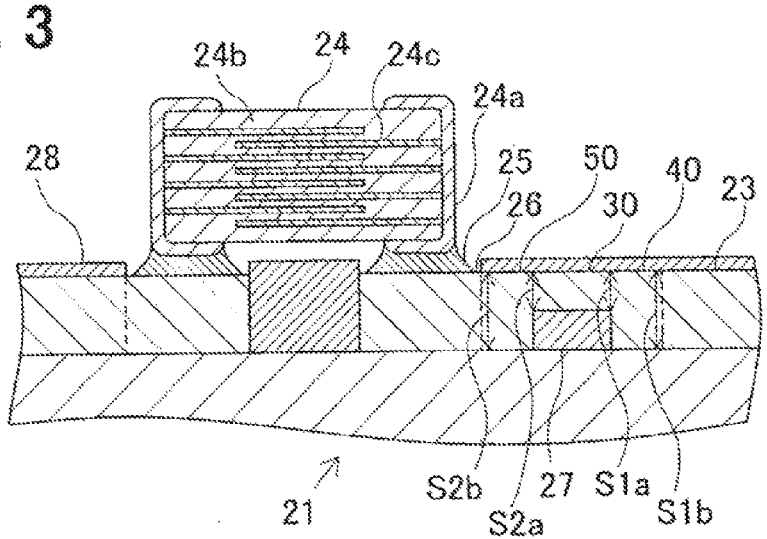
FIG. 3 is a cross-sectional view of the traction control device taken along line III-III in FIG. 2.

As shown in FIG. 2 and FIG. 3, one of the electronic components 22 on the circuit substrate 21 is a ceramic capacitor 24. The ceramic capacitor 24 may be formed by stacking a high-permittivity ceramic made of barium titanate and an internal electrode in layers for improving temperature characteristics and frequency characteristics, and thereby having a large capacity with a small size.

The ceramic capacitor 24 has outside electrodes 24a on either ends thereof. The outside electrodes 24a are mounted on respective lands 26 via solders 25. Between one of the lands 26 and the power supply wire 23, an interrupt wire 30 is coupled. The interrupt wire 30 melts by heat generated by an overcurrent and interrupts the electric coupling between the land 26 and the power supply wire 23 via the interrupt wire 30. Thus, the interrupt wire 30 can achieve an overcurrent protection depending on the circuit substrate 21.

The interrupt wire 30 has a wire width sufficiently smaller than a wire width of the power supply wire 23. The wire width means a dimension in a direction that is perpendicular to a direction of electric current on a surface of the circuit substrate 21. For example, the interrupt wire 30 has a wire width within a range from 0.2 mm to 0.3 mm, and the power supply wire 23 has a wire width of 2 mm. The lands 26 can work as component-mounted wires.

One end of the interrupt wire 30 is coupled with the power supply wire 23 via a connection wire 40, and the other end of the interrupt wire 30 is coupled with the land 26 via a connection wire 50. The connection wires 40 and 50 are made of conductive material, such as copper, in a manner similar to the interrupt wire 30 and the power supply wire 23. The connection wires 40 and 50 have a greater conductor volume than the interrupt wire 30. The connection wire 40 coupled with the power supply wire 23 can work as a first connection wire, and the connection wire 50 coupled with the land 26 can work as a second connection wire.

Figure 4:
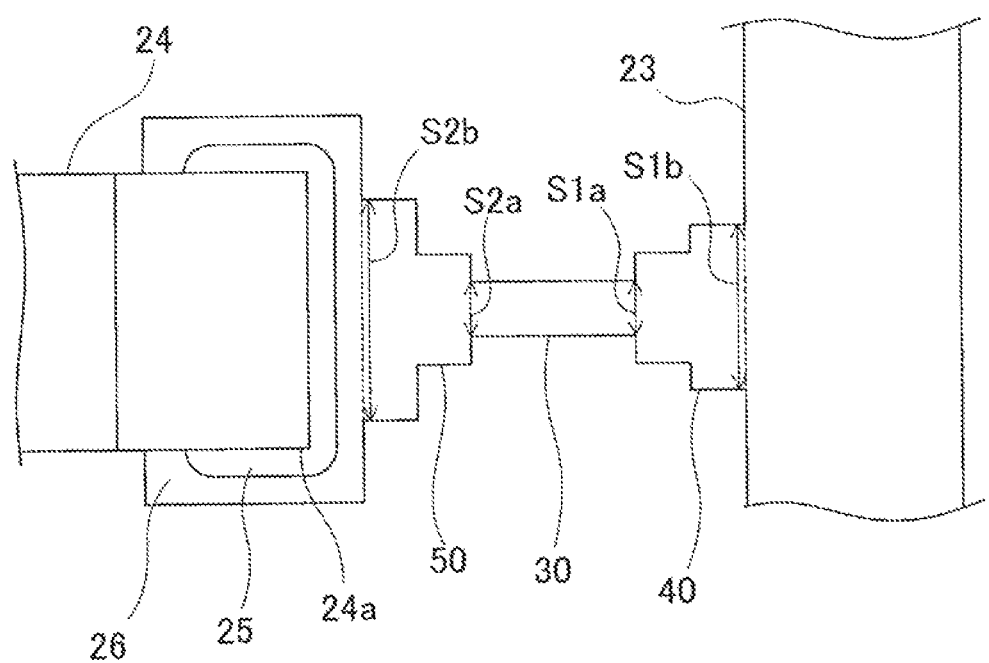
FIG. 4 is an enlarged view of a portion around an interrupt wire of the traction control device shown in FIG. 2.

As shown in FIG. 4, a wire width of the connection wire 40 increases toward the power supply wire 23 in a stepwise manner so that a cross-sectional area $S1a$ at an end of the connection wire 40 adjacent to the interrupt wire 30 is smaller than a cross-sectional area $S1b$ at the other end of the connection wire 40 adjacent to the power supply wire 23. Similarly, a wire width of the connection wire 50 increases toward the land 26 in a stepwise manner so that a cross-sectional area $S2a$ at an end of the connection wire 50 adjacent to the interrupt wire 30 is smaller than a cross-sectional area S2b at the other end of the connection wire 50 adjacent to the land 26.

As shown in FIG. 3, the interrupt wire 30 has a wire thickness thinner than wire thicknesses of the connection wires 40 and 50. In FIG. 3, thicknesses of wires, such as an interrupt wire 30, are shown in a magnified way. The wire thickness means a dimension in a direction that is perpendicular to the circuit substrate 21. On an inside of the interrupt wire 30, a heat transmission restriction member 27 is disposed. The heat transmission restriction member 27 is made of, for example, resist material, so that the heat restriction member 27 restricts transmission of heat toward an inside of the circuit substrate 21. The interrupt wire 30 is easily shaped to have the thinner thickness than the connection wires 40 and 50 by disposing the heat transmission restriction member 27 on the inside of the interrupt wire 30 during shape formation of the interrupt wire 30. Further, the cross-sectional areas S1a and S2a become smaller by disposing the heat transmission restriction member 27.

In the traction control device 20 having the above-described configuration, for example, when a short-circuit fault occurs in the ceramic capacitor 24 and an overcurrent flows in the interrupt wire 30, the interrupt wire 30 generates heat in accordance with the overcurrent. When the generated heat becomes greater than a predetermined temperature, the interrupt wire 30 melts, and the electric coupling via the interrupt wire 30 is interrupted. Accordingly, the other electronic components 22 coupled with the power supply wire 23 can be protected against the overcurrent. The current at interruption is not high enough to blow the fuse 14a. Thus, the damage of the traction control device 20 does not influence to the other electronic control devices 12 supplied with power via the fuse 14a. A time from generation of the overcurrent to the melting of the interrupt wire 30 is a few milliseconds, and a melting time of each of the fuses 14a, 14b is generally about 0.02 seconds. Thus, the overcurrent protection can be appropriately achieved even to an electronic control device or an electronic component that is required to improve a processing speed.

In particular, heat generated at the interrupt wire 30 by an overcurrent is transmitted to the power supply wire 23 via the connection wire 40. When the interrupt wire 30 having a small wire width is directly coupled with the power supply wire 23 having a large wire width, the heat is easily transmitted to the power supply wire 23. Thus, the temperature of the interrupt wire 30 decreases and the temperature decrease has a variation. Similarly, when the interrupt wire 30 is directly coupled with the land 26, the temperature of the interrupt wire 30 decreases and the temperature decrease has a variation. Further, since the heat transmitted from the interrupt wire 30 is concentrated at a connecting portion between the interrupt wire 30 and the land 26, the solder 25 adjacent to the interrupt wire 30 melts and a melt conductor generated by the melting of the interrupt wire 30 may scatter around the connecting portion between the interrupt wire 30 and the land 26.

In the traction control device 20 according the present embodiment, the heat generated at the interrupt wire 30 is transmitted to the power supply wire 23 via the connection wire 40, which has the smaller cross-sectional area S1a adjacent to the interrupt wire 30 compared with the cross-sectional area S1b adjacent to the power supply wire 23. Additionally, the heat generated at the interrupt wire 30 is transmitted to the land 26 via the connection wire 50, which has the smaller cross-sectional area S2a adjacent to the interrupt wire 30 compared with the cross-sectional area S2b adjacent to the land 26.

Thus, when heat generated at the interrupt wire 30 by an overcurrent is transmitted to the power supply wire 23 via the connection wire 40 and is transmitted to the land 26 via the connection wire 50, because heat required for melting the interrupt wire 30 is held by the connection wires 40 and 50, the heat is not absorbed excessively to the power supply wire 23 and the land 26 compared with a case where heat is transmitted directly to the power supply wire 23 and the land 26. Accordingly, a variation in a temperature rise of the interrupt wire 30 can be restricted, and a variation in the melting time can be restricted even when the melting time is short as described above. Thus, a decrease in an interrupt performance of the interrupt wire 30 can be restricted. In particular, the heat generated at the interrupt wire 30 by the overcurrent is gradually diffused in the connection wire 50 and is widely transmitted to the land 26. Thus, a local temperature rise in the land 26 can be restricted. Therefore, even when the ceramic capacitor 24 is mounted on the land 26 with the solder 25 having a lower melting point than a melting point of the interrupt wire 30, the solder 25 is less likely to be melted by the heat from the interrupt wire 30. In contrast, during a steady state of the traction control device 20, the interrupt wire 30 generates heat due to the current flowing through the interrupt wire 30. In the steady state, an overcurrent is not generated. Because the heat generated at the interrupt wire 30 can be diffused via the connection wires 40 and 50 during the steady state, a temperature rise in the interrupt wire 30 can be restricted and a long-term reliability of the traction control device 20 can be increased.

Because the heat transmission restriction member 27 having the wire thickness thinner than wire thicknesses of the connection wires 40 and 50 is disposed on the inside of the interrupt wire 30, the cross-sectional areas S1a and S2a of the interrupt wire 30 are easily decreased compared with a case where the heat transmission restriction member 27 is not disposed. Specifically, transmission of the heat generated by the interrupt wire 30 can be restricted by the heat transmission restriction member 27. Thus, the variation in the temperature rise of the interrupt wire 30 can be restricted. Additionally, because the wire thickness of the interrupt wire 30 becomes smaller, the melt conductor generated by the melting of the interrupt wire 30 has a smaller volume and adverse effect caused by a flow of the melt conductor to other electronic components 22 can be restricted.

Additionally, because the connection wires 40 and 50 have the greater conductor volumes than the interrupt wire 30, the connection wires 40 and 50 can store heat from the interrupt wire 30.

The power supply wire 23 is coupled with the battery 13, which supplies power not only to the traction control device 20 but also to other electronic control devices 12, by the power supply path, and the fuse 14a for protecting the traction control device 20 and other electronic control devices 12 is disposed on the power supply path. Even when a short-circuit fault occurs in the traction control device 20 including the interrupt wire 30, the interrupt wire 30 melts. Thus, influence of the short-circuit fault on the power supply to other electronic control devices 12 can be restricted.

Figure 5A:
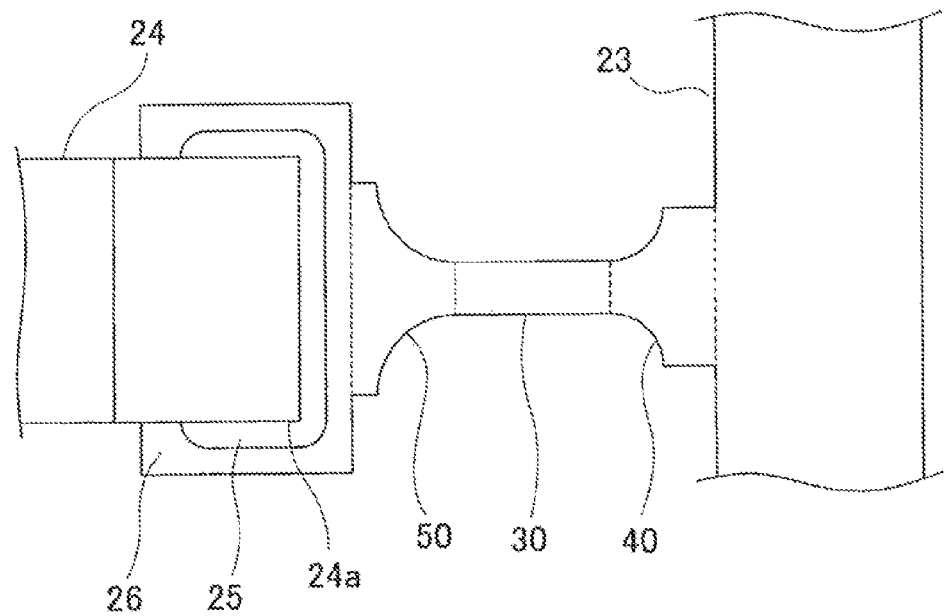
FIG. 5A and FIG. 5B are diagrams showing two examples of a part of a traction control device according to a first modification of the first embodiment.

A traction control device 20 according to a first modification of the first embodiment will be described with reference to FIG. 5A and FIG. 5B. As shown in FIG. 5A, in the traction control device 20, connection wires 40 and 50 may be partially arc-shaped. Specifically, the connection wire 40 is partially arc-shaped (R-shape) so that an area of a cross section, which is perpendicular to a direction from the interrupt wire 30 to the power supply wire 23, gradually increases toward the power supply wire 23. Similarly, the connection wire 50 is partially arc-shaped (R-shape) so that an area of a cross section, which is perpendicular to a direction from the interrupt wire 30 to the land 26, gradually increases toward the land 26.

The connection wires 40 and 50 having above-described shape can restrict a temperature decrease in the interrupt wire 30. Additionally, because a heat transmission path, which is extended in an arc manner, is secured by the connection wires 40 and 50, a local temperature rise in the interrupt wire 30 can be restricted.

As shown in FIG. 5A, side ends of the connection wire 40 are smoothly connected with respective side ends of the interrupt wire 30 and the wire width of the connection wire 40 gradually increases toward the power supply wire 23. Similarly, side ends of the connection wire 50 are smoothly connected with respective side ends of the interrupt wire 30 and the wire width of the connection wire 50 gradually increases toward the land 26. Thus, when the interrupt wire 30 and the connection wires 40 and 50 are formed using etching liquid, the etching liquid can uniformly flow at connecting portions of the interrupt wire 30 and the connection wires 40 and 50. Accordingly, the etching liquid is less likely to stay at the connecting portions and a variation in the wire width of the interrupt wire 30 can be restricted. Thus, a decrease in the interrupt performance by the interrupt wire 30 can be restricted.

Figure 5B:
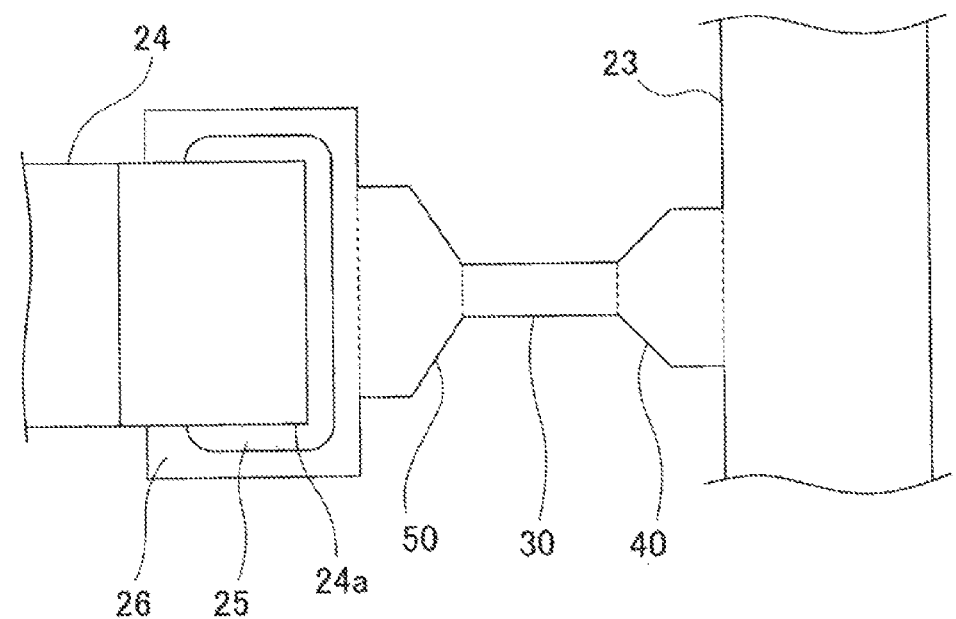

As shown in FIG. 5B, in the traction control device 20 according to the first modification of the first embodiment, the connection wires 40 and 50 may also be partially taper-shaped. Specifically, the connection wire 40 is partially taper-shaped so that the area of the cross section gradually increases toward the power supply wire 23. Similarly, the connection wire 50 is partially taper-shaped so that the area of the cross section gradually increases toward the land 26. The connection wires 40 and 50 having a tapered-shape provide similar effects with the connection wires 40 and 60 having an arc-shape.

Figure 6:
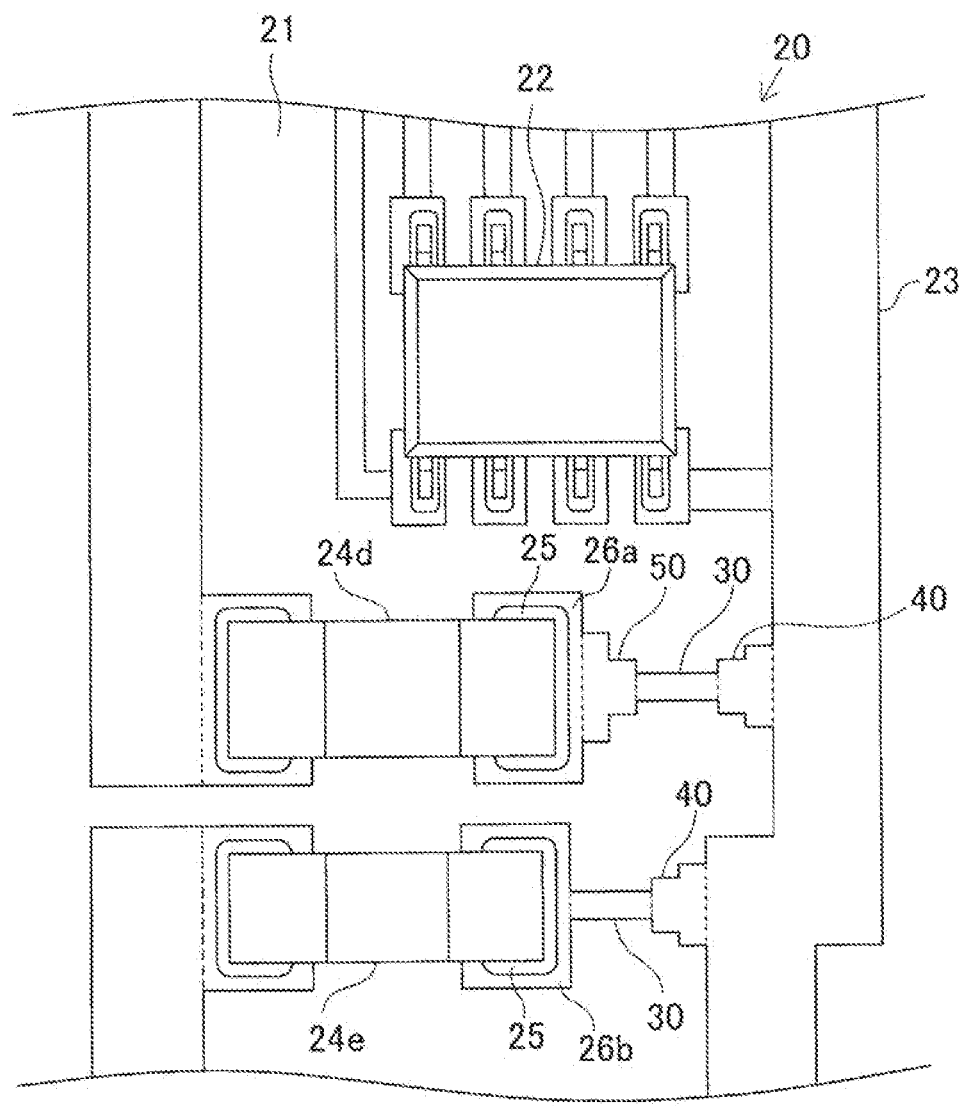
FIG. 6 is a diagram showing a part of a traction control device according to a second modification of the first embodiment.

A traction control device 20 according to a second modification of the first embodiment will be described with reference to FIG. 6. In the traction control device 20, a plurality of interrupt wires 30 may be disposed respectively to a plurality of electronic components 22. In each of the interrupt wires 30, at least a connection wire 40 or 50 is disposed between an end of the interrupt wire 30 and the power supply wire 23 or a component-mounted wire, such as the land 26. As shown in FIG. 6, an interrupt wire 30 is electrically coupled with a land 26a of an electronic component 24d via a connection wire 40 and is coupled with the power supply wire 23 via a connection wire 50. Another interrupt wire 30 is electrically coupled with the power supply wire 23 via a connection wire 40.

Figure 7:
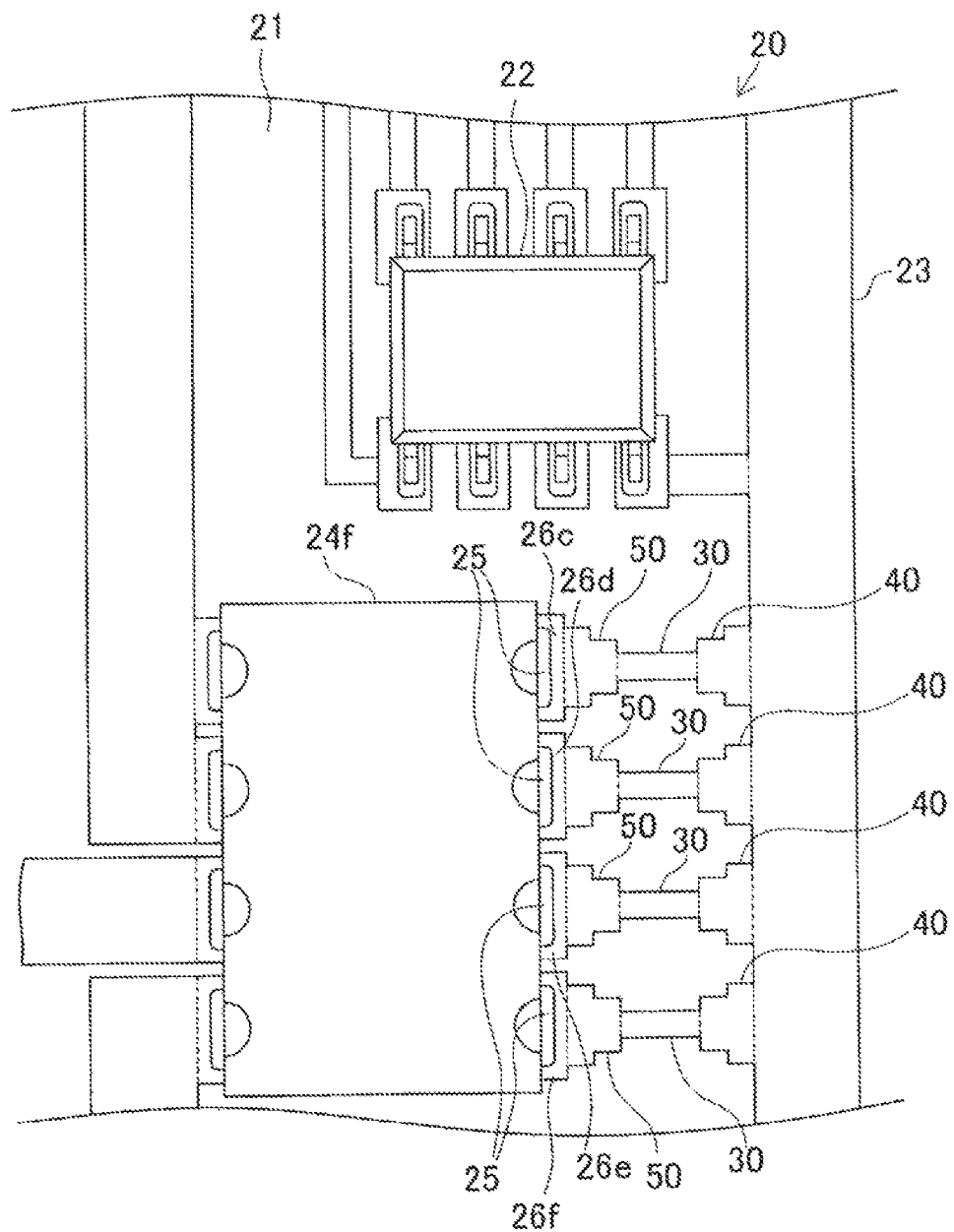
FIG. 7 is a diagram showing a part of a traction control device according to a third modification of the first embodiment.

A traction control device 20 according to a third modification of the first embodiment will be described with reference to FIG. 7. In the traction control device 20, at least one interrupt wire 30 may be coupled between an array-type ceramic capacitor 24f having a plurality of outside electrodes and the power supply wire 23. The ceramic capacitor 24f is formed by arraying four multilayer capacitors in a package. As shown in FIG. 7, the ceramic capacitor 24f has four outside electrodes which are respectively mounted on lands 26c to 26f. Four interrupt wires 30 are disposed between respective lands 26c to 26f and the power supply wire 23. Each of the interrupt wires 30 is coupled with the power supply wire 23 via the connection wire 40, and is coupled with a corresponding land of the lands 26c to 26f via the connection wire 50.

As described above, in a case where a plurality of interrupt wires 30 is disposed on the circuit substrate 21, the variation in the temperature rise in each of the interrupt wires 30 can be restricted by disposing the connection wires 40 and 50 in each interrupt wire 30. Thus, the decrease in the interrupt performance by the interrupt wires 30 can be restricted.

A traction control device 20 according to a fourth modification first embodiment will be described. In the traction control device 20, the interrupt wire 30 may be made of material, such as aluminum, having a lower thermal conductivity than the connection wires 40 and 50. Accordingly, heat generated at the interrupt wire 30 by an overcurrent is less likely to be transmitted to the connection wires 40 and 50, and thereby the variation in the temperature rise of the interrupt wire 30 can be restricted. Further, the decrease in the interrupt performance by the interrupt wire 30 can be restricted.

Second Embodiment

A traction control device 20a according to a second embodiment of the present disclosure will be described with reference to FIG. 8 and FIG. 9.

The traction control device 20a according to the present embodiment includes connection wires 40a and 50a instead of the connection wires 40 and 50 described in the forgoing embodiment.

Figure 8:
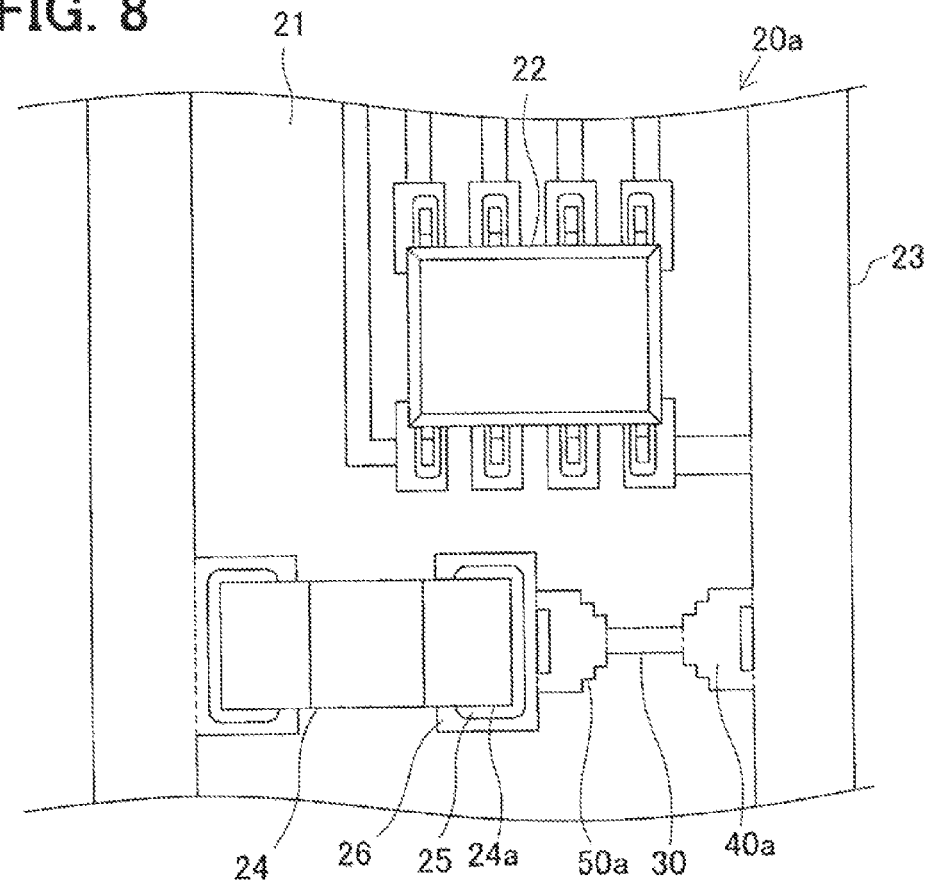
FIG. 8 is a diagram showing a part of a traction control device according to a second embodiment of the present disclosure.
Figure 9:
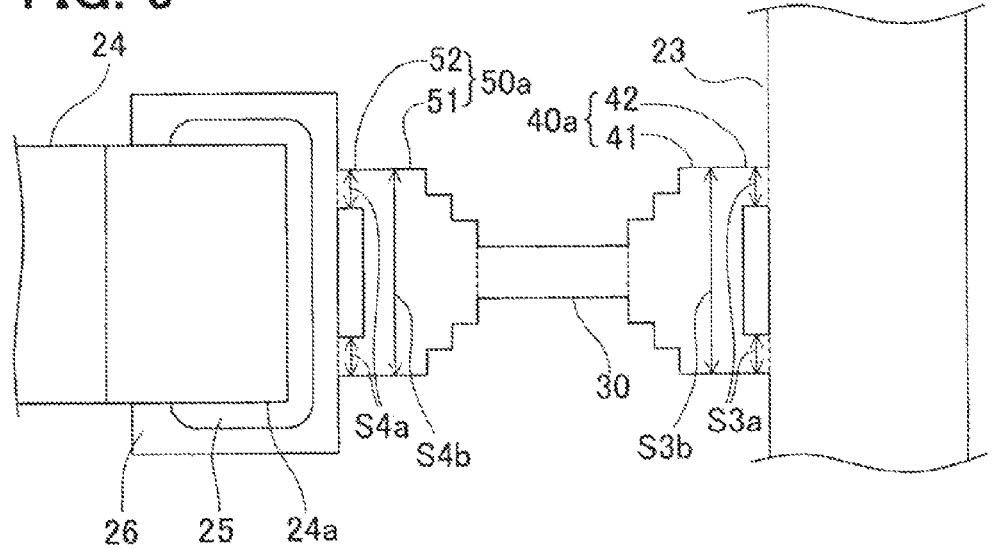
FIG. 9 is an enlarged view of a portion around an interrupt wire of the traction control device shown in FIG. 8.

As shown in FIG. 8 and FIG. 9, the connection wire 40a includes a heat storage portion 41 adjacent to the interrupt wire and a narrow-down portion 42 adjacent to the power supply wire 23. The narrow-down portion 42 is designed so that a total cross-sectional area $S3a$ of a connecting portion of the connection wire 40a with the power supply wire 23 is smaller than a cross-sectional area of a middle portion of the connection wire 40a, that is, a cross-sectional area $S3b$ of the heat storage portion 41.

Similarly, the connection wire 50a includes a heat storage portion 51 adjacent to the interrupt wire 30 and a narrow-down portion 52 adjacent to the land 26. The narrow-down portion 52 is designed so that a total cross-sectional area $S4a$ of a connecting portion of the connection wire 50a with the land 26 is smaller than a cross-sectional area of a middle portion of the connection wire 50a, that is, a cross-sectional area $S4b$ of the heat storage portion 51.

Thus, heat transmitted to the connection wire 40a from the interrupt wire 30 is less likely to be transmitted to the power supply wire 23 via the narrow-down portion 42, and the heat storage portion 41 stores heat. Because the heat storage portion 41 stores heat from the interrupt wire 30, when the interrupt wire 30 melts, a temperature of the heat storage portion 41 is relatively high. Thus, the variation in the temperature rise of the interrupt wire 30 can be restricted, and a decrease in the interrupt performance by the interrupt wire 30 can be restricted with certainty. Additionally, by disposing the connection wire 50a in a similar manner with the connection wire 40a, the variation in the temperature rise of the interrupt wire 30 can be restricted, and a decrease in the interrupt performance by the interrupt wire 30 can be restricted with certainty.

By setting the interrupt wire 30 and the connection wires 40a and 50a to have a predetermined depth and to be made of a predetermined material, an interrupt condition is fixed so as to restrict the variation, and a set of the interrupt wire 30 and the connection wires 40a and 50a can be widely used. In addition, because heat storage amounts of the connection wires 40a and 50a can be respectively controlled with volumes of the heat storage portions 41 and 51, the melting time of the interrupt wire 30 can be easily controlled.

Because the connecting portion of the connection wire 40a with the power supply wire 23 is formed as the two narrow-down portions 42, when the heat from the interrupt wire 30 is transmitted to the power supply wire 23 via the two narrow-down portions 42, the heat is transmitted to the power supply wire 23 while being diffused in the narrow-down portions 42. Thus, a local temperature rise in the power supply wire 23 can be restricted. Additionally, by disposing the connection wire 50a in a similar manner with the connection wire 40a, a local temperature rise in the land 26 can be restricted.

The number of the narrow-down portions 42 of the connection wire 40a may also be one or more than two depending on the interrupt condition. Similarly, the number of the narrow-down portions 52 of the connection wire 50a may also be one or more than two depending on the interrupt condition.

Figure 10A:
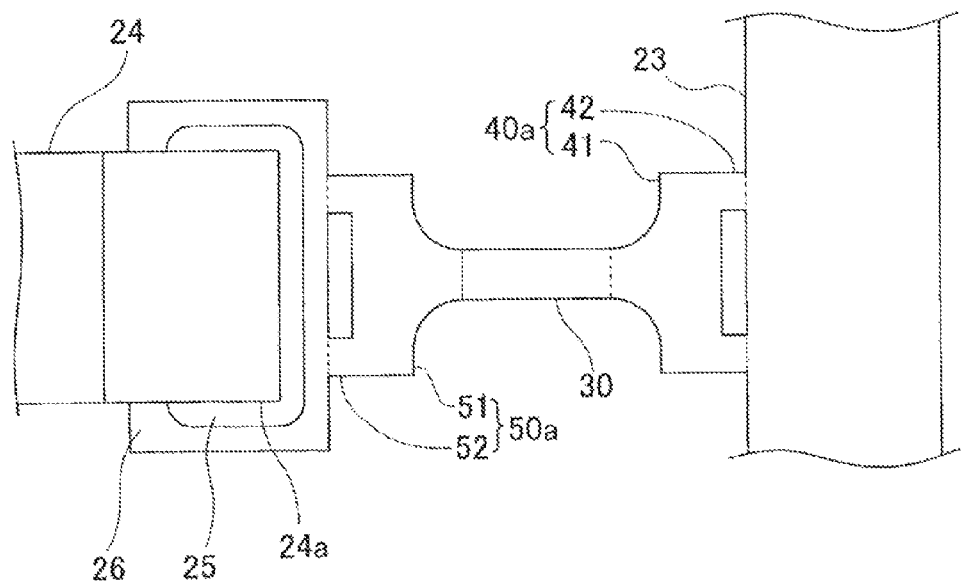
FIG. 10A and FIG. 10B are diagrams showing two examples of a part of a traction control device according to a modification of the second embodiment.

A traction control device 20a according to a modification of the second embodiment will be described with reference to FIG. 10A and FIG. 10B. As shown in FIG. 10A, the heat storage portion 41 of the connection wire 40a and the heat storage portion 51 of the connection wire 50a may be partially arc-shaped. Specifically, the heat storage portion 41 of the connection wire 40a is partially arc-shaped (R-shape) so that an area of a cross section, which is perpendicular to the direction from the interrupt wire 30 to the power supply wire 23, gradually increases toward the power supply wire 23. Similarly, the heat storage portion 51 of the connection wire 50a is partially arc-shaped (R-shape) so that an area of a cross section, which is perpendicular to the direction from the interrupt wire 30 to the land 26, gradually increases toward the land 26.

Figure 10B:
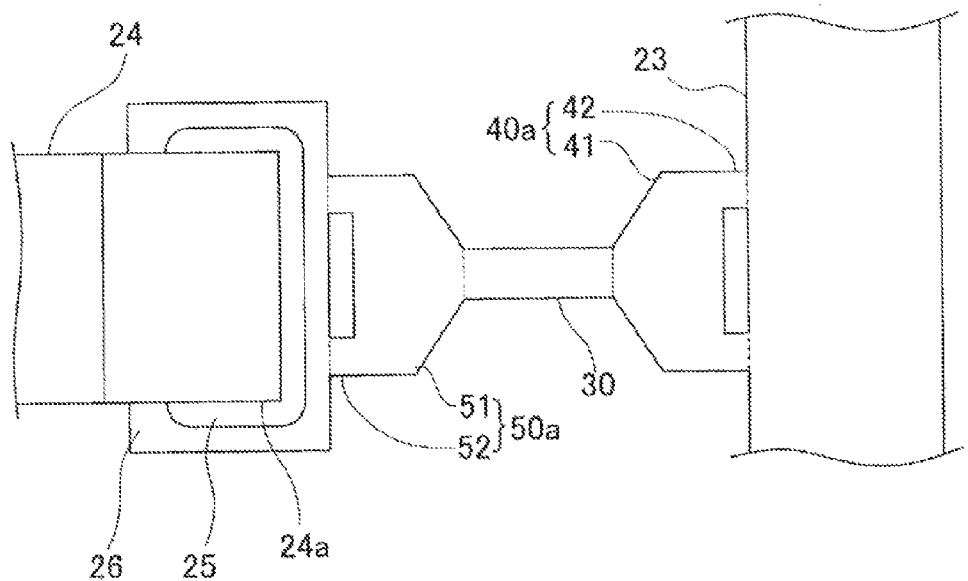

As shown in FIG. 10B, the heat storage portion 41 of the connection wire 40a and the heat storage portion 51 of the connection wire 50a may also be partially taper-shaped. Specifically, the heat storage portion 41 of the connection wire 40a is partially taper-shaped so that the area of the cross section gradually increases toward the power supply wire 23. Similarly, the heat storage portion 51 of the connection wire 50a is partially taper-shaped so that the area of the cross section gradually increases toward the land 26.

Connection wires 40a and 50a having above-described shape can restrict a temperature decrease in the interrupt wire 30. Additionally, because a heat transmission path, which is extended in an arc manner, is secured by the connection wires 40 and 50, a local temperature rise in the interrupt wire 30 can be restricted. In particular, because the heat transmitted from the interrupt wire 30 can be transmitted uniformly in the heat storage portions 41 and 51, the heat can be uniformly stored in the heat storage portions 41 and 51.

The above-described configurations of the connection wires 40a and 50a may be applied to other embodiments and modifications.

Third Embodiment

A traction control device 20b according to a third embodiment of the present disclosure will be described with reference to FIG. 11.

The traction control device 20b according to the present embodiment includes an interrupt wire 30a instead of the interrupt wire 30 described in the forgoing embodiments. In order to achieve a densely mounting, the power supply wire 23 is disposed between the lands 26 on which the outside electrodes 24a of the ceramic capacitor 24 are mounted.

Figure 11:
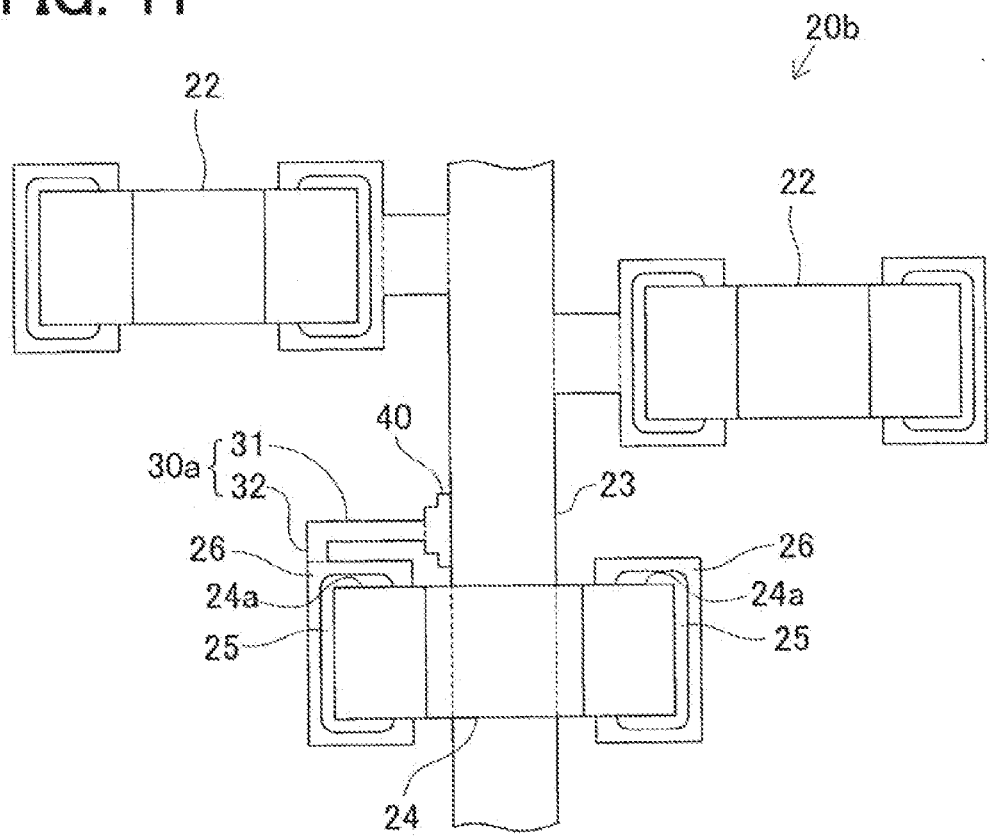
FIG. 11 is a diagram showing a part of a traction control device according to a third embodiment of the present disclosure.

As shown in FIG. 11, the interrupt wire 30a includes a first wire section 31 and a second wire section 32 that is shorter than the first wire section 31. The first wire section 31 and the second wire section 32 are coupled to each other at a predetermined angle. The predetermined angle is determined so that the first wire section 31 is coupled with the power supply wire 23 and the second wire section 32 is coupled with the land 26. For example, the predetermined angle is 90 degrees.

By bending the interrupt wire 30a at the predetermined angle, a wire length of the interrupt wire 30a can be increased compared with a case where the interrupt wire 30a has a straight shape while coupling the power supply wire 23 and the land 26. Accordingly, a required wire length of the interrupt wire 30a can be secured in a limited mounting area. Thus, the decrease in the interrupt performance by the interrupt wire 30a can be restricted and a size of the traction control device 20b can be decreased.

In the traction control device 20b according to the present embodiment, the first wire section 31 is coupled with the power supply wire 23, and the second wire section 32 is coupled with the land 26. Alternatively, the first wire section 31 may be coupled with the land 26, and the second wire section 32 may be coupled with the power supply wire 23. Further, a position of the predetermined angle at which the first wire section 31 and the second wire section 32 are coupled to each other may be set according to positions of the power supply wire 23 and the land 26. In FIG. 11, the interrupt wire 30a is coupled with the power supply wire 23 via the connection wire 40. The interrupt wire 30a may be coupled with the land 26 via the connection wire 50. The first wire section 31 may have a arrow portion at a middle portion of an entire length of the interrupt wire 30a including the first wire section 31 and the second wire section 32. The narrow portion has a wire width narrower than the other portion of the first wire section 31. Accordingly, when the interrupt wire 30a melts, the interrupt wire 30a is likely to melt at the narrow portion. Thus, a variation in a melted portion can be restricted. In order to restrict a heat concentration at a connecting portion of the first wire section 31 and the second wire section 32, the connecting portion may be formed in such a manner that the connecting portion has similar wire widths with the first wire section 31 and the second wire section 32 at adjacent two side ends. The above-described configuration of the interrupt wire 30a may be applied to other embodiments and modifications.

Fourth Embodiment

A traction control device 20c according to a fourth embodiment of the present disclosure will be described with reference to FIG. 12 and FIG. 13.

In the traction control device 20c according to the present embodiment, a solder resist layer 28, which functions as a protective layer to protect the surface of the circuit substrate 21, defines an opening portion 28a so that at least a portion of the interrupt wire 30 is exposed outside. In FIG. 12, the solder resist layer 28 is not shown for convenience of drawing.

Figure 12:
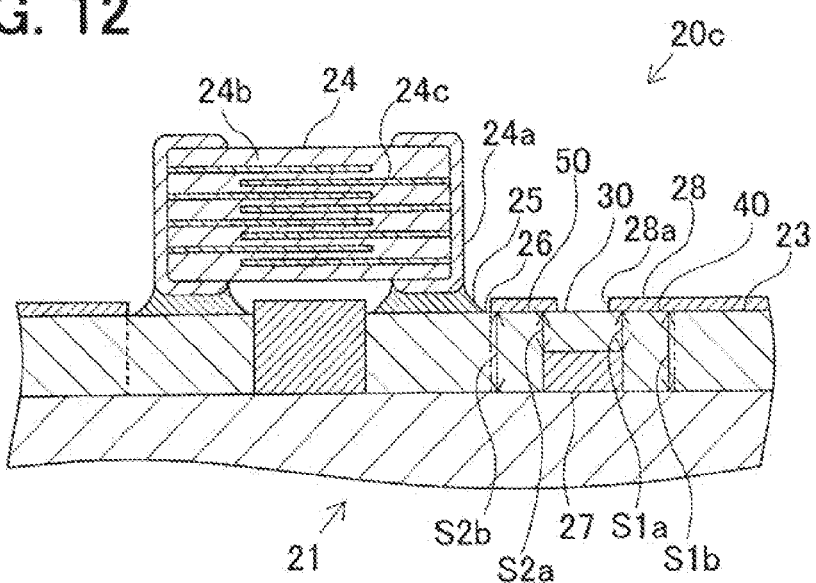
FIG. 12 is a diagram showing a part of a traction control device according to a fourth embodiment of the present disclosure.
Figure 13:
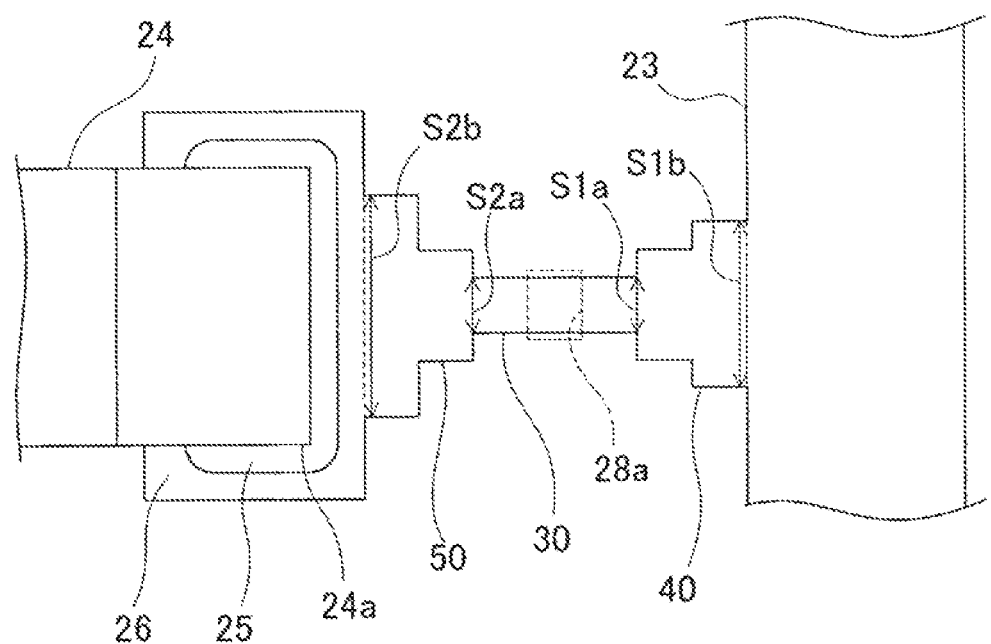
FIG. 13 is an enlarged view of a portion around an interrupt wire of the traction control device shown in FIG. 12.

As shown in FIG. 12 and FIG. 13, the solder resist layer 28 defines the opening portion 28a so that the middle portion of the entire length of the interrupt wire 30, which is most likely to generate heat, is exposed outside. Reasons of providing the opening portion 28a will be described with reference to FIG. 14 and FIG. 15.

Figure 14:
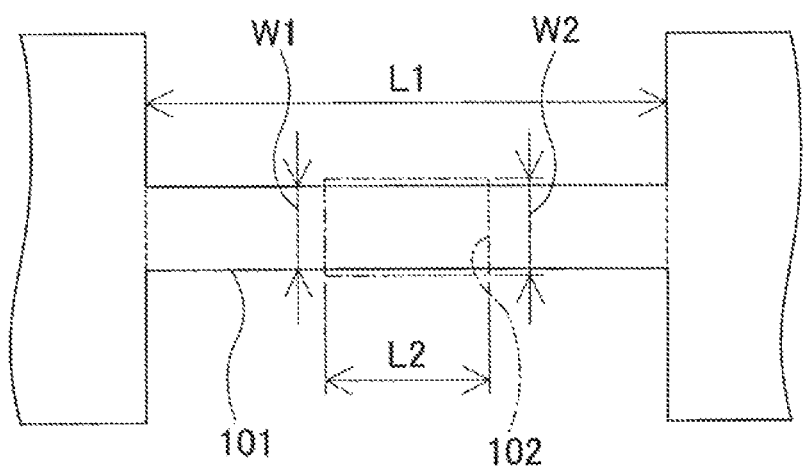
FIG. 14 is a diagram showing a device including a test interrupt wire and a test opening portion.
Figure 15:
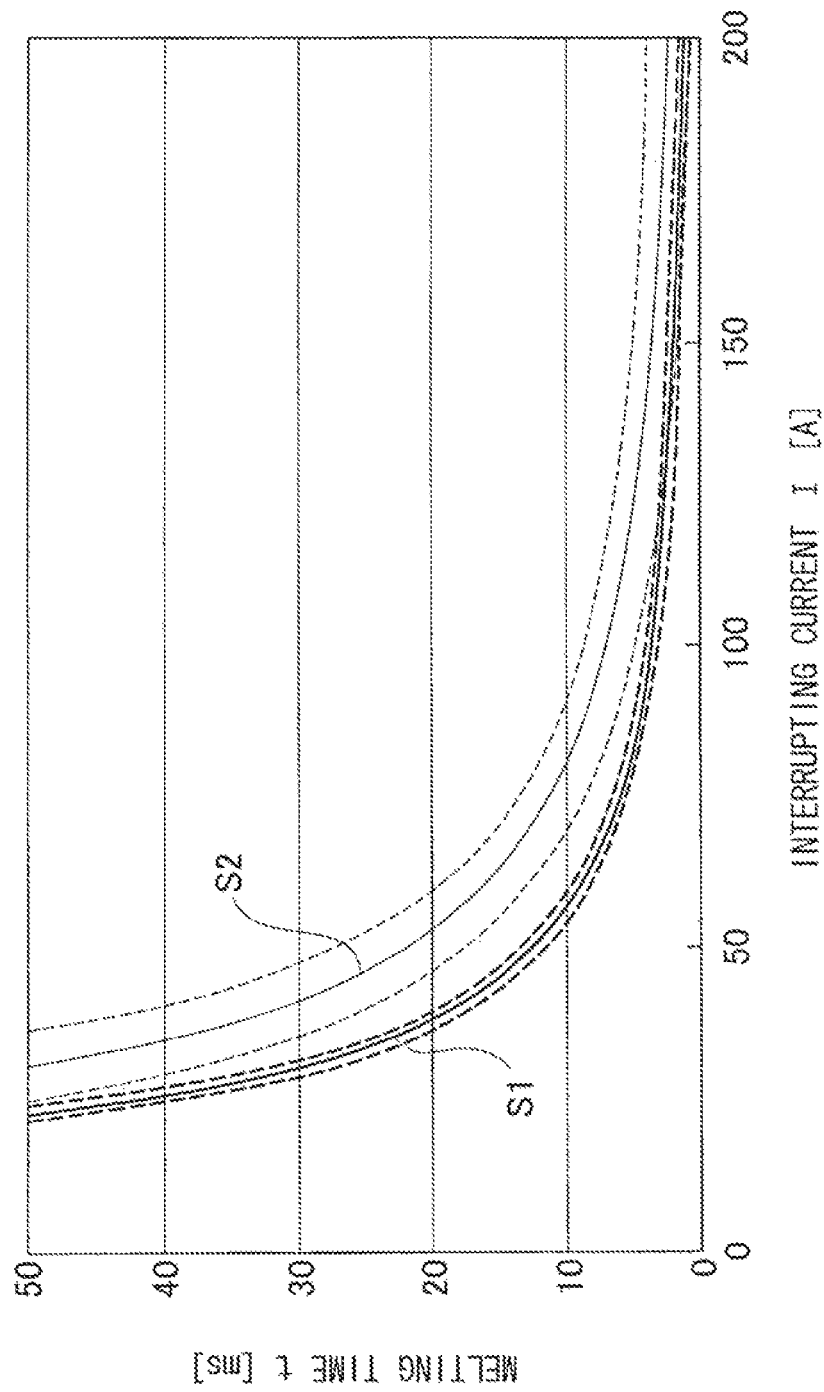
FIG. 15 is a graph showing a relationship between an interrupting current and a melting time of the test interrupt wire in each case where the test opening portion is defined and where the test opening portion is not defined.

In a device shown in FIG. 14, a part of a test interrupt wire 101 is exposed outside through a test opening portion 102 defined by a solder resist layer. The test interrupt wire 101 is supplied with a predetermined current, and an interrupting current I with which the test interrupt wire 101 melts and a melting time t when the test interrupt wire 101 melts are measured. Furthermore, an interrupting current I and a melting time t of a test interrupt wire 101 in a case where a solder resist layer does not define a test opening portion 102 are also measured. The test interrupt wire 101 has an entire length L1 of 2.55 mm and has a width W1 of 0.25 mm. The test opening portion 102 has an opening length L2 of 0.6 mm in a direction parallel to a length direction of the test interrupt wire 101 and has an opening width W2 of 0.25 mm in a width direction of the test interrupt wire 101. In FIG. 14, the opening width W2 is drawn as being longer than the with W1 for convenience of drawing.

In FIG. 14, a bold solid line S1 shows a relationship between the interrupting current I and the melting time t of the test interrupt wire 101, a part of which is exposed through the test opening portion 102, and a range between bold dashed lines centered on the bold solid line S1 shows a variation range of the melting time t with respect to the interrupting current I. A thin solid line 82 shows a relationship between the interrupting current I and the melting time t of the test interrupt wire 101 in a case where a test opening portion 102 is not defined, and a range between thin dashed lines centered on the thin solid line 82 shows a variation range of the melting time t with respect to the interrupting current I.

As shown in FIG. 14, at the same interrupting current, the melting time t decreases and the variation range decreases when the test opening portion 102 is defined by the solder resist layer. In contrast, in the case where the test opening portion 102 is not defined by the solder resist layer, the melting time t of the test interrupt wire 101 increases in each overcurrent range and the variation range increases compared with the case where the test opening portion 102 is defined. This is because a melt conductor generated by melting of the test interrupt wire 101 flows from the test opening portion 102 and the melt conductor is less likely to stay at a position of the test interrupt wire 101 before melting.

Thus, when at least a part of the interrupt wire 30 is exposed through the opening portion 28a, the melting time t decreases, the overcurrent protection action can be achieved early, and a temperature rise in a protected component can be restricted. Furthermore, a time for which a voltage of the power supply wire 23 decreases due to interruption by the interrupt wire 30 can be reduced. In addition, because the variation of the melting time t decreases, a capacity of a stabilizing capacitor that is designed in view of the melting time of the interrupt wire 30 in each device or each circuit can be reduced, and a cost and a size can be reduced. Furthermore, because the melting time t decreases also in a rated region of current, a circuit can be designed more freely.

Thus, when the interrupt wire 30 melts in accordance with heat generated by the overcurrent, a melt conductor generated by melting of the interrupt wire 30 flows from the opening portion 28a. Accordingly, the melt conductor is less likely to stay at a position of the interrupt wire 30 before melting, variations in the melt position and the melting time due to stay of the melt conductor can be restricted, and a decrease in an interrupt performance by the interrupt wire 30 can be restricted.

In the traction control device 20c according to the present embodiment, the opening portion 26a is defined so that the middle portion of the interrupt wire 30 which is most likely to melt is exposed outside. Alternatively, the opening portion 28a may be defined so that another portion of the interrupt wire 30 or the whole interrupt wire 30 is exposed outside. The above-described configuration of the opening portion 28a, through which at least a portion of the interrupt wire 30 is exposed, may be applied to other embodiments and modifications.

Figure 16:
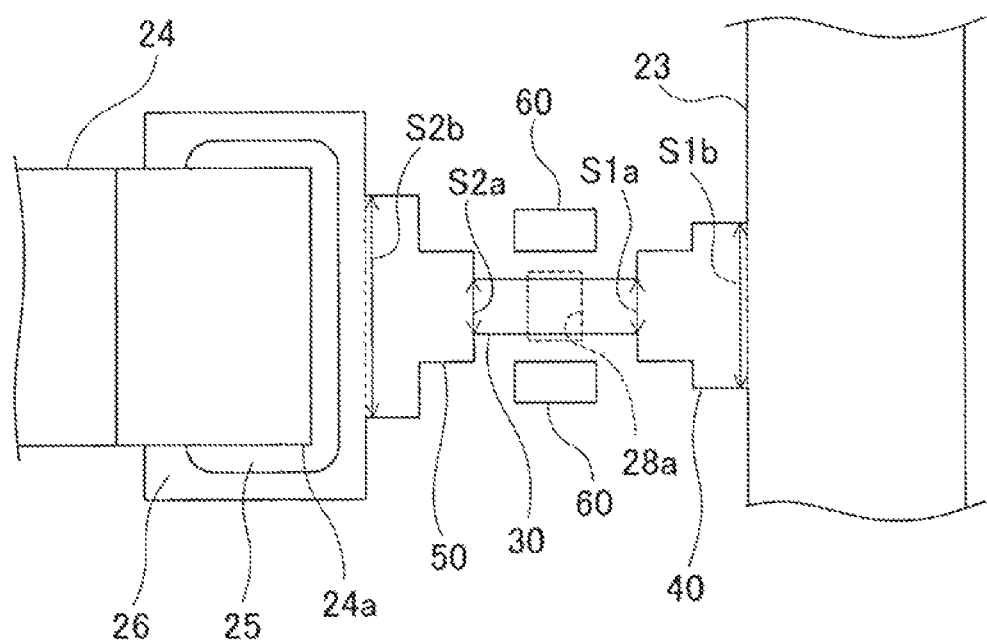
FIG. 16 is a diagram showing a part of a traction control device according to a modification of the fourth embodiment.

A traction control device 20c according to a modification of the fourth embodiment will be described with reference to FIG. 16. As shown in FIG. 16, a pair of adherent wires 60 may be disposed adjacent to the interrupt wire 30. The adherent wire 60 can work as an adherent member or an adsorption member to which the melt conductor generated by melting of the interrupt wire 30 adheres. The adherent wire 60 may be made of the same material as the power supply wire 23. When the melt conductor of the high temperature is generated by melting of the interrupt wire 30, the melt conductor flow on the surface of the circuit substrate 21 and adheres to the adherent wires 60 adjacent to the interrupt wire 30.

Accordingly, the melt conductor is held by the adherent wires 60 and loses flowability by releasing heat and being hardened. Thus, a decrease in the interrupt performance by the interrupt wire 30 can be restricted, and influence of the flow of the melt conductor on other electronic components can be restricted. The adherent wires 60 may be disposed with respect to the interrupt wire 30, a part of which is exposed outside through the opening portion 28a, the adherent wires 60 may also be disposed with respect to the interrupt wire 30 whose surface is entirely covered with the solder resist layer 28, and the adherent wires 60 may also be disposed with respect to the interrupt wire 30 not covered with the solder resist layer 28.

Fifth Embodiment

Figure 17:
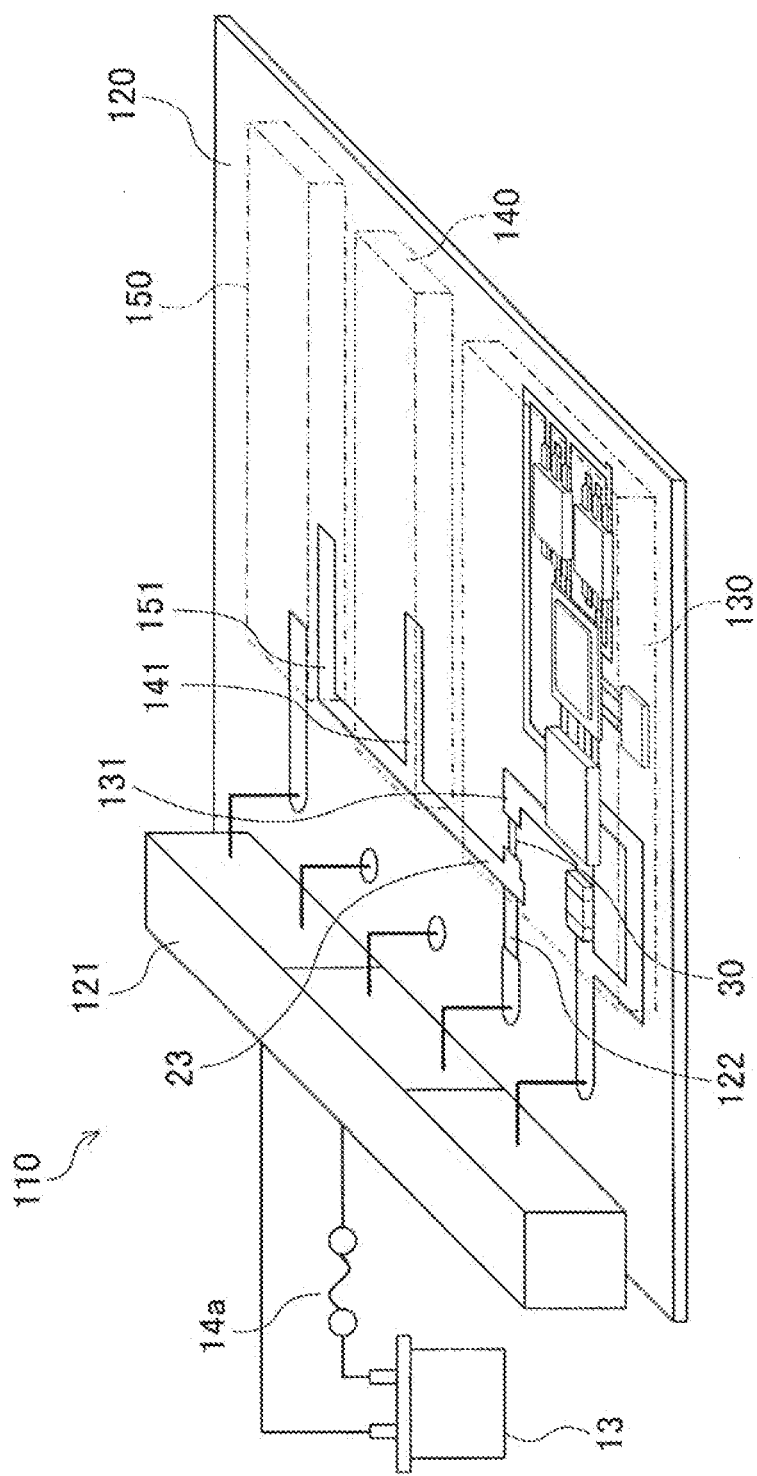
FIG. 17 is a diagram showing a configuration of a traction control device according to a fifth embodiment of the present disclosure.

An electronic control device 110 according to a fifth embodiment of the present disclosure will be described with reference to FIG. 17. The electronic control device 110 includes a substrate 120 and circuit blocks 130, 140, 150 disposed on the substrate 120. The circuit block 130 performs a similar function to the traction control device 20 according to the first embodiment. The circuit blocks 140, 150 perform different functions from the circuit block 130. The different functions are more important than the function of the circuit block 130. For example, the circuit block 140 performs a function corresponding to the engine ECU, and the circuit block 150 performs a function corresponding to the brake ECU.

The circuit blocks 130, 140, 150 are electrically coupled with the power supply wire 23, which supplies electric power from the battery 13, via branch wires 131, 141, 151, respectively. The above-described interrupt wire 30 is disposed on the branch wire 131 coupled with the circuit block 130 so as to function as overcurrent protection for the circuit block 130. On the power supply wire 23, an interrupt wire 122 that functions as overcurrent protection for the substrate 120 is disposed. In other words, the interrupt wire 122, which protects the substrate 120 including all the circuit blocks 130-150, and the interrupt wire 30, which protects the circuit block 130, are disposed on the substrate 120.

Accordingly, even, when overcurrent is caused by a short-circuit fault in the circuit block 130 and the interrupt wire 30 melts due to the overcurrent, the circuit blocks 140, 150 are still electrically coupled with the power supply wire 23 via the branch wires 141, 151. Thus, only the circuit block 130 coupled with the melt interrupt wire 30 stops and the circuit blocks 140, 150 keep operating. In particular, since the function of the circuit block 130 is less important than the functions of the circuit blocks 140, 150, influence of the stop of the less important circuit block 130 on the functions of the more important circuit blocks 140, 150 can be restricted. When an overcurrent is caused by a short-circuit fault in the circuit blocks 140, 150 without the interrupt wire 30, the overcurrent flows to the power supply wire 23, the interrupt wire 122 melts, and the circuit blocks 130, 140, 150 are deactivated. Thus, the overcurrent is less likely to flow to other circuit block.

Especially in a case where a wire width of the interrupt wire 30 is smaller than a wire width of the interrupt wire 122 so that a current value at interruption by the interrupt wire 30 is smaller than a current value at interruption by the interrupt wire 122, when an overcurrent is caused by a short-circuit fault in the circuit block 130, the interrupt wire 30 melts earlier than the interrupt wire 122 with certainty. Thus, the influence on other circuit blocks 140, 150 can be restricted with certainty. The above-described configuration including two interrupt wires on one substrate may be applied to other embodiments and modifications.

Other Embodiments

The present invention is not limited to the above-describe embodiments and the above-described modifications may include various changes and modifications. For example, the connection wire 40 coupled at one end of the interrupt wire 30 may be electrically coupled with the common wire, which is shared by the electronic components 22 to be protected against overcurrent, instead of the power supply wire 23.

The connection wire 50 coupled at the other end of the interrupt wire 30 may be electrically coupled with a component-mounted wire on which an electronic component is disposed, such as an internal layer fully covered with a protective layer made of, for example, solder resist.

At least one of the connection wires 40 and 50, and the interrupt wire 30 may be provided for each substrate for overcurrent protection of the electronic control devices 12 including the engine ECU the brake ECU, the steering ECU, the body ECU, and the navigation ECU.

The above-described other embodiments may also be applied to the connection wires other than the connection wires 40 and 50, and the interrupt wires other than the interrupt wire 30.

What is claimed is:
1. An electronic control device comprising:
a substrate;
a plurality of component-mounted wires disposed on the substrate;
a plurality of electronic components mounted on the respective component-mounted wires;
a common wire disposed on the substrate and coupled with each of the electronic components;
an interrupt wire coupled between one of the component-mounted wires and the common wire, the interrupt wire configured to melt in accordance with heat generated by an overcurrent so as to interrupt a coupling between the one of the component-mounted wires and the common wire via the interrupt wire;
a connection wire via which the interrupt wire is coupled with a connection object that is one of the common wire and the one of the component-mounted wires;
a solder disposed between each of the electronic components and a corresponding one of the component-mounted wires, the solder having a lower melting point than the interrupt wire; and
a protective layer covering a surface of the substrate including the interrupt wire, the protective layer defining an opening portion, and only a portion of the interrupt wire in a length direction of the interrupt wire being exposed through the opening portion,
wherein the connection wire has a first end portion adjacent to the interrupt wire and a second end portion adjacent to the connection object,
wherein a cross-sectional area of the first end portion is smaller than a cross-sectional area of the second end portion,
wherein the interrupt wire is disposed adjacent to the electronic component other than the electronic component that is coupled with the interrupt wire, and the interrupt wire is disposed adjacent to a wire other than the component-mounted wire and the common wire that are coupled with the interrupt wire, and
wherein the protective layer is provided by a solder resist layer which is directly attached on a surface of the interrupt wire.

2. The electronic control device according to claim 1, further comprising
an interrupt wire and a connection wire coupled between another of the component-mounted wires and the common wire.

3. The electronic control device according to claim 1, wherein the interrupt wire includes a first wire section and a second wire section that is shorter than the first wire section, and
wherein the first wire section and the second wire section coupled with each other at a predetermined angle, the predetermined angle is determined so that one of the first wire section and the second wire section is coupled with the common wire and the other is coupled with the one of the component-mounted wires.

4. The electronic control device according to claim 1, further comprising
an adherent member disposed adjacent to the interrupt wire, the adherent member configured so that a melt conductor generated by melting of the interrupt wire adheres to the adherent member.

5. The electronic control device according to claim 1, wherein the common wire is a power supply wire.

6. A control system comprising:
a power supply path coupled with a power source;
a fuse disposed on the power supply path;
a device coupled with the power source by the power supply path via the fuse; and
the electronic control device according to claim 5,
wherein the power supply wire in the electronic control device is coupled with the power source by the power supply path via the fuse.

7. The electronic control device according to claim 1, further comprising
a heat transmission restriction member disposed on an inside of the interrupt wire so as to restrict transmission of heat toward an inside of the substrate, wherein the interrupt wire has a smaller thickness than the connection wire in a direction perpendicular to the substrate, wherein the interrupt wire has an outside surface that is partially exposed to outside via the opening portion and an inside surface disposed opposite to the outside surface, and wherein the inside surface is contacted with the heat transmission restriction member so that the interrupt wire is attached to the substrate.

8. The electronic control device according to claim 1, wherein the opening portion has a width greater than a width of the interrupt wire.

9. The electronic control device according to claim 1, wherein, when the interrupt wire melts in accordance with the heat generated by the overcurrent, melted conductor of the interrupt wire flows out from the opening portion.

* * * * *